US012692597B2

(12) United States Patent (10) Patent No.: US 12,692,597 B2
Kim et al. (45) Date of Patent: Jul. 28, 2026

(54) THIN FILM DEPOSITION METHOD

(71) Applicant: JUSUNG ENGINEERING CO., LTD., Gwangju-Si (KR)

(72) Inventors: Yong Hyun Kim, Gwangju-Si (KR); Il Houng Park, Gwangju-Si (KR); Chang Kyun Park, Gwangju-Si (KR); Won Ju Oh, Gwangju-Si (KR); Dong Hwan Lee, Gwangju-Si (KR); Yong Hyun Lee, Gwangju-Si (KR); Jun Seok Lee, Gwangju-Si (KR); Byung Gwan Lim, Gwangju-Si (KR); Chul Joo Hwang, Gwangju-Si (KR)

(73) Assignee: JUSUNG ENGINEERING CO., LTD. (KR)

( * ) Notice: Subject to any disclaimer, the term of this patent is extended or adjusted under 35 U.S.C. 154(b) by 0 days.

(21) Appl. No.: 18/567,002

(22) PCT Filed: Jun. 3, 2022

(86) PCT No.: PCT/KR2022/007898
§ 371 (c)(1),
(2) Date: Dec. 4, 2023

(87) PCT Pub. No.: WO2022/255833
PCT Pub. Date: Dec. 8, 2022

(65) Prior Publication Data
US 2024/0263307 A1     Aug. 8, 2024

(30) Foreign Application Priority Data
Jun. 4, 2021     (KR) ........................ 10-2021-0072554

(51) Int. Cl.
*C23C 16/455* (2006.01)

(52) U.S. Cl.
CPC .. *C23C 16/45536* (2013.01); *C23C 16/45553* (2013.01); *C23C 16/45559* (2013.01)

(58) Field of Classification Search
CPC .............. C23C 16/40; C23C 16/45536; C23C 16/45554; C23C 16/45559
See application file for complete search history.

(56) References Cited

U.S. PATENT DOCUMENTS 6,905,543 B1 * 6/2005 Fair ..................... C23C 16/0218
427/253
10,340,125 B2 * 7/2019 Winkler .................. C23C 16/50
(Continued)

FOREIGN PATENT DOCUMENTS

CN        104674191 A    6/2015
JP        H11131233 A    5/1999
(Continued)

OTHER PUBLICATIONS

Van Toan, Nguyen, et al., "Aluminum doped zinc oxide deposited by atomic layer deposition and its applications to micro/nano devices". Scientific Reports (2011) 11:1204, pp. 1-12.*
(Continued)

*Primary Examiner* — Bret P Chen
(74) *Attorney, Agent, or Firm* — Renaissance IP Law Group LLP

(57) ABSTRACT

Provided is a method for depositing a thin film, which is performed to deposit a thin film on a substrate. A method for depositing a thin film includes supplying a source gas together with a first diffusion gas onto a substrate provided in a process space, and supplying a reactant gas together with a second diffusion gas onto the substrate to continuous with the supplying of the source gas. The first diffusion gas
(Continued)

SUPPLY SOURCE GAS TOGETHER WITH FIRST DIFFUSION GAS —S100

SUPPLY REACTION GAS TOGETHER WITH SECOND DIFFUSION GAS —S200 and source gas and the second diffusion gas and reactant gas are supplied onto the substrate through paths different from each other.

12 Claims, 3 Drawing Sheets

(56)                    References Cited

U.S. PATENT DOCUMENTS

| | | | | |
|---|---|---|---|---|
| 10,366,864 B2 * | 7/2019 | Winkler | ........... | H01J 37/32449 |
| 2006/0029748 A1 | 2/2006 | Ishizaka et al. | | |
| 2012/0295427 A1 * | 11/2012 | Bauer | ................. | H10D 62/021 |
| | | | | 438/494 |
| 2012/0323008 A1 * | 12/2012 | Barry | ........................ | C07F 1/00 |
| | | | | 206/524.1 |
| 2013/0075912 A1 | 3/2013 | Wakatsuki et al. | | |
| 2015/0111391 A1 * | 4/2015 | Hwang | ............. | C23C 16/45551 |
| | | | | 438/758 |
| 2018/0023195 A1 * | 1/2018 | Muneshwar | ............ | C23C 16/52 |
| | | | | 118/724 |
| 2018/0119283 A1 * | 5/2018 | Fukazawa | ............... | C23C 16/34 |
| 2018/0223429 A1 * | 8/2018 | Fukazawa | ......... | C23C 16/45542 |
| 2019/0035607 A1 * | 1/2019 | Kim | .................. | H01J 37/32834 |
| 2020/0365386 A1 | 11/2020 | Benjamin Raj et al. | | |

FOREIGN PATENT DOCUMENTS

| | | | |
|---|---|---|---|
| JP | 2001234348 A | 8/2001 | |
| JP | 2015506416 A | 3/2015 | |
| JP | 2017505987 A | 2/2017 | |
| KR | 10-2004-0008334 | * 1/2004 | .......... H01L 21/205 |
| KR | 20090099140 A | 9/2009 | |
| KR | 20150133670 A | 11/2015 | |
| KR | 20170099904 A | 9/2017 | |
| KR | 20190098533 A | 8/2019 | |
| TW | 200420747 A | 10/2004 | |
| TW | 201433652 A | 9/2014 | |
| TW | 202022155 A | 6/2020 | |
| WO | 2007066472 A1 | 6/2007 | |

OTHER PUBLICATIONS

Hamelmann, Frank U., et al., "Thin film zinc oxide deposited by CVD and PVD". Journal of Physics: Conference Series 764 (2016) 012001, pp. 1-8.*

Maruyama, Toshiro, et al., "Indium tin oxide thin films prepared by chemical vapour deposition". Thin Solid Films, vol. 203, Issue 2, Aug. 30, 1991, pp. 297-302.*

Suh, Seigi, et al., "General Synthesis of Homoleptic Indium Alkoxide Complexes and the Chemical Vapor Deposition of Indium Oxide Films". J. Am. Chem. Soc. 2000, 122, 9396-9404.*

Ritala, Mikko, et al., "Atomic Layer Deposition of Oxide Thin Films with Metal Alkoxides as Oxygen Sources". Science, vol. 288, Apr. 14, 2000, pp. 319-321.*

Groner, M.D., et al., "Gas diffusion barriers on polymers using atomic layer deposition". Applied Physics Letters 88, 051907 2006 pp. 1-3.*

International Search Report for PCT/KR2022/007898, mailed Sep. 7, 2022.

Written Opinion for PCT/KR2022/007898, mailed Sep. 7, 2022.

* cited by examiner

10 : 12, 14
20 : 22, 24
30 : 32, 34, 36, 38
40 : 42, 44
50 : 52, 54
60 : 62, 64

(a)                              (b)

THIN FILM DEPOSITION METHOD

TECHNICAL FIELD

The present disclosure relates to a method for depositing a thin film, and more particularly, to a method for depositing a thin film, which is performed to deposit a thin film on a substrate.

BACKGROUND ART

A metal oxide thin film, for example, an organic metal oxide thin film has excellent characteristics of low power and high mobility and is used as a semiconductor element, a protective layer disposed on a display device or a solar cell, a transparent conductive layer, or a semiconductor layer.

The metal oxide thin film may include zinc (Zn) oxide doped with at least one of indium (In) or gallium (Ga), for example, indium zinc oxide (IZO), gallium zinc oxide (GZO), indium gallium zinc oxide (IGZO), etc., and such a metal oxide thin film has various characteristics depending on a composition ratio of indium (In), gallium (Ga), and zinc (Zn).

In accordance with the related art, a metal oxide thin film is deposited through an atomic layer deposition (ALD) process. In the atomic layer deposition process, a process cycle including a process of supplying a source gas containing indium (In), gallium (Ga) and zinc (Zn), a process of purging the source gas, a process of supplying a reactant gas containing oxygen (O), and a process of purging the reactant gas is performed several times to form a metal oxide thin film on a substrate.

However, when the metal oxide thin film is deposited through the atomic layer deposition process as described above, there is a limitation in that it takes a lot of time to deposit the thin film in the process of purging the source gas and the process of purging the reactant gas. That is, since the time taken to purge the source gas and the reactant gas and the time taken to adjust a temperature of the substrate again after purging the source gas and the reactant gas increase, there is a limitation in that productivity is deteriorated due to the increase in time taken to perform the process of depositing the thin film.

DISCLOSURE OF THE INVENTIVE CONCEPT

TECHNICAL PROBLEM

The present disclosure provides a method for depositing a thin film, which is capable of improving a process speed.

TECHNICAL SOLUTION

In accordance with an exemplary embodiment, a method for depositing a thin film includes: supplying a source gas together with a first diffusion gas onto a substrate provided in a process space; and supplying a reactant gas together with a second diffusion gas onto the substrate to continuous with the supplying of the source gas, wherein the first diffusion gas and source gas, and the second diffusion gas and reactant gas are supplied onto the substrate through paths different from each other.

The first diffusion gas may be mixed with the source gas in a path through which the source gas is supplied, and the second diffusion gas may be mixed with the reactant gas in a path through which the reactant gas is supplied.

In the supplying of the source gas, a supply amount of first diffusion gas may be controlled to be different from a supply amount of second diffusion gas.

In the supplying of the source gas, a supply amount of first diffusion gas may be controlled to be relatively less than a supply amount of second diffusion gas.

In the supplying of the source gas, the second diffusion gas may be supplied together with the first diffusion gas and the source gas onto the substrate, and in the supplying of the reactant gas, the first diffusion gas may be supplied together with the second diffusion gas and the reactant gas onto the substrate.

In the supplying of the source gas and the supplying of the reactant gas, a supply amount of first diffusion gas may be differently controlled.

The supply amount of first diffusion gas in the supplying of the source gas may be controlled to be relatively less than the supply amount of first diffusion gas in the supplying of the reactant gas.

In the supplying of the reactant gas, power may be applied to generate plasma in the process space.

A process cycle comprising the supplying of the source gas and the supplying of the reactant gas may be performed several times.

Each of the first diffusion gas and the second diffusion gas may comprise an inert gas.

The source gas may include a gas containing at least one of indium (In), gallium (Ga), or zinc (Zn), and the reactant gas comprises a gas containing oxygen (O).

In accordance with another exemplary embodiment, a method for depositing a thin film includes: a first process of supplying a first diffusion gas and a source gas through a first gas supply path formed in a gas injection part and supplying a second diffusion gas through a second gas supply path formed in the gas injection part; and a second process of supplying the first diffusion gas through the first gas supply path and supplying the second diffusion gas and the reactant gas through the second gas supply path, wherein a process cycle in which the first process and the second process are continuously performed is performed repeatedly.

ADVANTAGEOUS EFFECTS

According to the exemplary embodiment, the process speed at which the thin film is deposited on the substrate may increase.

That is, the process time may be minimized by omitting the process of purging the source gas and the process of purging the reactant gas in the atomic layer deposition process in accordance with the related art.

In addition, even though the process of purging the source gas and the process of purging the reactant gas are omitted, the thin film having the quality equivalent to that of the thin film formed in the atomic layer deposition process in accordance with the related art may be formed.

MODE FOR CARRYING OUT THE INVENTIVE CONCEPT

Figure 1:
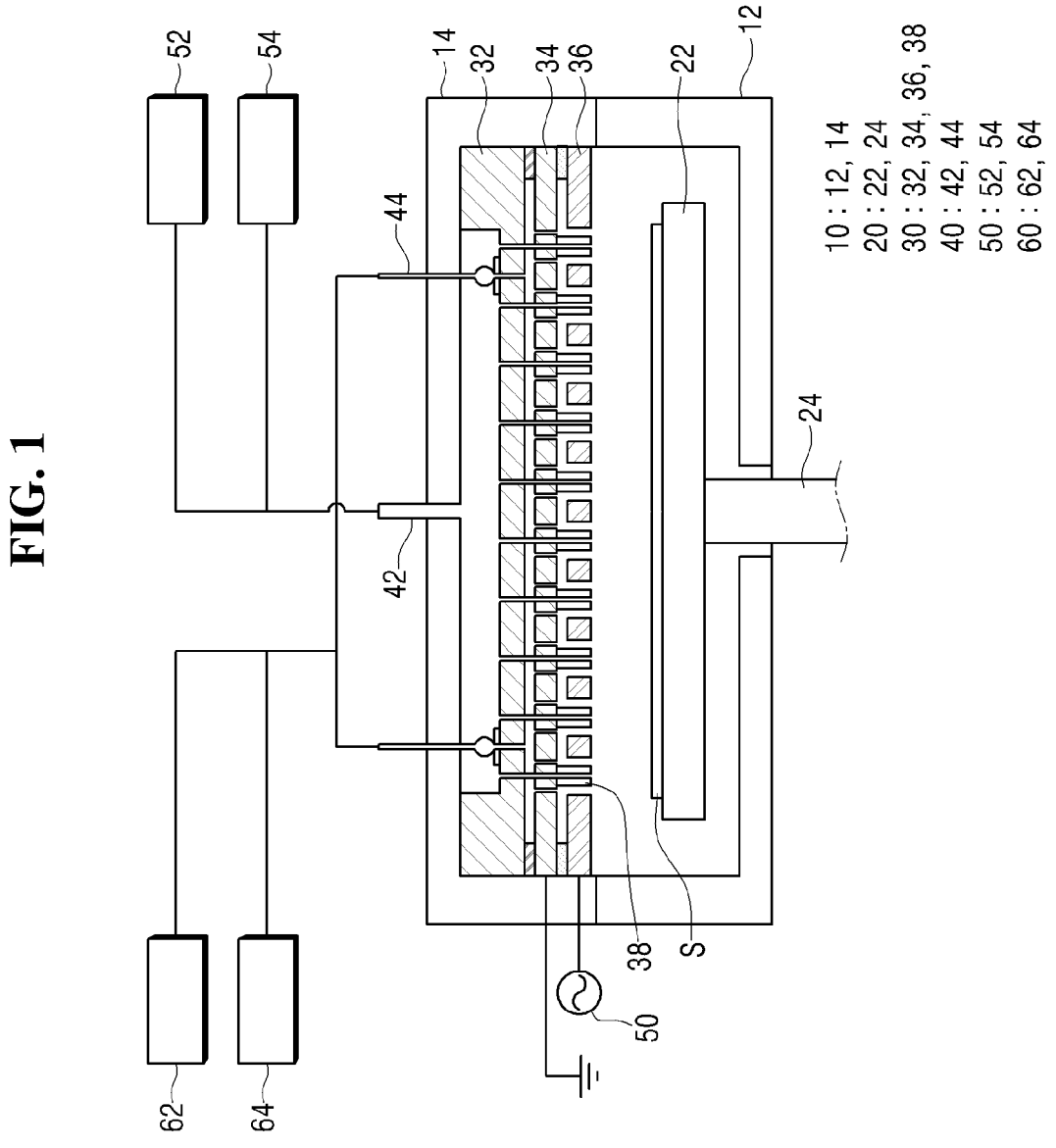
FIG. 1 is a schematic view illustrating a deposition apparatus in accordance with an exemplary embodiment.

Hereinafter, exemplary embodiments will be described in detail with reference to the accompanying drawings. The present inventive concept may however, be embodied in different forms and should not be construed as limited to the exemplary embodiments set forth herein. Rather, these embodiments are provided so that the present inventive concept will be thorough and complete, and will fully convey the scope of the present inventive concept to those skilled in the art. In the figures, the dimensions of layers and regions may be exaggerated for clarity of illustration. Like reference numerals refer to like elements throughout.

FIG. 1 is a schematic view illustrating a deposition apparatus in accordance with an exemplary embodiment.

Referring to FIG. 1, a deposition apparatus in an exemplary embodiment is an apparatus for depositing a thin film, for example, a metal oxide thin film on a substrate and includes a chamber 10, a substrate support part provided in the chamber 10 to support a substrate S provided in the chamber 10, a gas injection part 30 provided in the chamber 10 to face the substrate support part 20 and injecting a process gas toward the substrate support part 20, and an RF power source 50 applying power to generate plasma inside the chamber 10.

In addition, the deposition apparatus may further include a first gas supply part 50 providing a source gas and a first diffusion gas to the gas injection part 30 and a second gas supply part 60 providing a reactant gas and a second diffusion gas to the gas injection part 30 and also may further include a supply tube 40 configured to connect each of the first gas supply part 50 and the second gas supply part 60 to the gas injection part 30. In addition, the deposition apparatus may further include a controller (not shown) that controls supply amounts of source gas and first diffusion gas provided from the first gas supply part 50, supply amounts of reactant gas and second diffusion gas provided from the second gas supply part 60, and the RF power source 50.

Here, a first gas supply path, through which a first gas, for example, the source gas and the first diffusion gas is received from the first gas supply part 50 and is supplied onto the substrate S, and a second gas supply path, through which a second gas, for example, the reactant gas and the second diffusion gas is received from the second gas supply part 60 and is supplied onto the substrate S are separately provided in the gas injection part 30.

The chamber 10 provides a predetermined process space and is maintained to be sealed. The chamber 10 may include a body 12 including an approximately circular or square-shape plane and a sidewall extending upward from the plane and having a predetermined space and a cover 14 having an approximately circular or square shape and disposed on the body 12 to seal the chamber 10. However, the chamber 10 is not limited thereto and may be manufactured in various shapes corresponding to the shape of the substrate.

An exhaust port (not shown) may be provided on a predetermined area of a bottom surface of the chamber 10, and an exhaust tube (not shown) connected to the exhaust port may be provided outside the chamber 10. Also, the exhaust tube may be connected to an exhaust device (not shown). A vacuum pump such as a turbo molecular pump may be used as the exhaust device. Therefore, the inside of the chamber may be vacuumized to a predetermined reduced pressure atmosphere, for example, to a predetermined pressure of approximately 0.1 mTorr or less by the exhaust device. The exhaust tube may be installed not only on the bottom surface of the chamber 10, but also on a side surface of the chamber 10 under the substrate support part 20 to be described later. In addition, a plurality of exhaust tubes and the exhaust device corresponding thereto may be further installed to reduce an exhaust time.

The substrate provided into the chamber 10, in which the thin film formation process is performed, is seated on the substrate support part 20. Here, a transparent substrate may be used as the substrate S. For example, a silicon substrate, a glass substrate, or a plastic substrate when implementing a flexible display may be used as the substrate S. In addition, a reflective substrate may be used as the substrate S, and in this case, a metal substrate may be used. The metal substrate may be made of stainless steel (SUS), titanium (Ti), molybdenum (Mo), or an alloy thereof. When using the metal substrate as the substrate S, an insulating film may be disposed on the metal substrate. The substrate support part 20 may include an electrostatic chuck to adsorb and maintain the substrate S by using electrostatic force so that the substrate S is seated and supported. Alternatively, the substrate support part 20 may support the substrate S through vacuum adsorption or mechanical force.

The substrate support part 20 maybe provided in a shape corresponding to a shape of the substrate S, for example, a circular shape or a rectangular shape. The substrate support part 20 may include a substrate support 22 on which the substrate S is seated and an elevator 24 disposed under the substrate support 22 to elevate the substrate support 22. Here, the substrate support 22 maybe manufactured to be larger than the substrate S, and the elevator 24 may be provided to support at least one area of the substrate support 22, for example, a central portion. When the substrate S is seated on the substrate support 22, the substrate support 22 may move to approach the gas injection part 30. Also, a heater (not shown) may be installed in the substrate support 22. The heater generates heat to a predetermined temperature to heat the substrate support 22 and the substrate S seated on the substrate support 22 so that the thin film is uniformly deposited on the substrate S.

The supply tube 40 may be installed to pass through a cover 14 of the chamber 10 and may extend to connect the gas injection part 30, the first gas supply part 50, and the second gas supply part 60 to each other. Here, the supply tube 40 may include a first supply tube 42 connecting a space between a top surface of an upper frame 32 to be described later and the first gas supply part 50 and a second supply tube 44 connecting a space between a top surface of a lower frame 34 to be described later and a bottom surface of the upper frame 32 to the second gas supply part 60.

The first gas supply part 50 provides the source gas together with the first diffusion gas to the gas injection part 30 through the first supply tube 42. Here, the first gas supply part 50 may include a source gas supply part 52 configured to supply the source gas and a first diffusion gas supply part 54 configured to supply the first diffusion gas. In this case, the source gas supply part 52 may be connected to one end of the first supply tube 42, and the first diffusion gas supply part 54 may be connected to an extension path of the first supply tube 42 connecting the gas injection part 30 to the source gas supply part 52. The source gas may include a source gas for forming the metal oxide thin film, for example, a gas containing at least one of indium (In), gallium (Ga), or zinc (Zn). In addition, the first diffusion gas may include an inert gas for diffusing the source gas, for example, argon (Ar) or a nitrogen ($N_2$) gas. Although FIG. 1 illustrates that one source gas supply part 52 is provided for convenience of explanation, the source gas supply part 52 may not necessarily provide one gas and thus may provide each of a gas containing indium (In), a gas containing gallium (Ga), and a gas containing zinc (Zn) or provide a gas selected from the plurality of gases.

The second gas supply part 60 provides the reactant gas together with the second diffusion gas to the gas injection part 30 through the second supply tube 44. Here, the second gas supply part 60 may include a reactant gas supply part 62 configured to supply the reactant gas and a second diffusion gas supply part 64 configured to supply the second diffusion gas. In this case, the reactant gas supply part 62 may be connected to one end of the second supply tube 44, and the second diffusion gas supply part 64 may be connected to an extension path of the second supply tube 44 connecting the gas injection part 30 to the reactant gas supply part 62.

The reactant gas may include a reactant gas for forming the metal oxide thin film, for example, may be a gas containing oxygen (O). In addition, the second diffusion gas may include an inert gas for diffusing the reactant gas, for example, argon (Ar) or a nitrogen ($N_2$) gas.

The gas injection part 30 is installed inside the chamber 10, for example, on a bottom surface of the cover 14, a first gas supply path for injecting and supplying the source gas and the first diffusion gas onto the substrate S and a second gas supply path for injecting and supplying the reactant gas and the second diffusion gas onto the substrate S are provided in the gas injection part 30. The first gas supply path 110 and the second gas supply path 210 may be provided to be independently separated from each other so that the first gas and the second gas are separated from each other without being mixed with each other within the gas injection part 30 and then supplied onto the substrate S.

The gas injection part 30 may include an upper frame 32 and a lower frame 34. Here, the upper frame 32 is detachably coupled to the bottom surface of the cover 14, and simultaneously, a portion of a top surface of the upper frame 310, for example, a central portion of the top surface of the upper frame 310 is spaced a predetermined distance from the bottom surface of the cover 14. Thus, the source gas and the first diffusion gas, which are supplied from the first gas supply part 50, may be diffused into a space between the top surface of the upper frame 32 and the bottom surface of the cover 14. Also, the lower frame 34 is installed to be spaced a predetermined distance from the bottom surface of the upper frame 32. Thus, the reactant gas and the second diffusion gas, which are supplied from the second gas supply part 60, may be diffused into a space between the top surface of the lower frame 34 and the bottom surface of the upper frame 32. The upper frame 32 and the lower frame 34 may be connected to each other along an outer circumferential surface to define the spaced space therein and be integrated with each other and may have a structure that seals the outer circumferential surface by a separate sealing member.

In the first gas supply path 110, the source gas and the first diffusion gas, which are supplied from the first gas supply part 50, may be diffused into the space between the bottom surface of the cover 14 and the upper frame 32 to pass through the upper frame 32 and the lower frame 34 and then be supplied into the chamber 10. Also, in the second gas supply path 210, the reactant gas and the second diffusion gas, which are supplied from the second gas supply part 60, may be diffused in the space between the bottom surface of the upper frame 32 and the top surface of the lower frame 34 to pass through the lower frame 34 and then be supplied into the chamber 10. The first gas supply path and the second gas supply path may not communicate with each other. Thus, the source gas and first diffusion gas and the reactant gas and second diffusion gas may be supplied through the different paths within the chamber 10, respectively.

A first electrode 38 may be installed on the bottom surface of the lower frame 34, and the second electrode 36 may be installed to be spaced downward from the lower frame 34 and outward from the first electrode 38 by a predetermined distance. In this case, the lower frame 34 and the second electrode 36 may be disposed to be connected along an outer circumferential surface and may have a structure in which the outer circumferential surface is sealed by a separate sealing member.

As described above, when the first electrode 38 and the second electrode 36 are installed, the source gas and the first diffusion gas may pass through the first electrode 38 and be injected onto the substrate, and the reactant gas and the second diffusion gas may be injected onto the substrate through a spaced space between the first electrode 38 and the second electrode 36.

Here, RF power may be applied from the RF power source 50 to any one of the lower frame 34 and the second electrode 36. In FIG. 1, a structure in which the lower frame 34 is grounded, and the RF power is applied to the second electrode 36 is illustrated as an example. When the lower frame 34 is grounded, the first electrode 38 installed on the bottom surface of the lower frame 34 is also grounded. Thus, when the RF power source 50 is applied to the second electrode 36, a first activation region, i.e., a first plasma region, is formed between the gas injection part 30 and the substrate support part 20, and a second activation region, i.e., a second plasma region may be formed between the first electrode 38 and the second electrode 36.

As a result, when the reactant gas and the second diffusion gas are injected through the spaced space between the first electrode 38 and the second electrode 36, the reactant gas is activated in the spaced space between the first electrode 38 and the second electrode 36, which corresponds to the inside of the gas injection part 30, i.e., over a region from the second plasma region to the first plasma region. Therefore, in the deposition apparatus in accordance with an exemplary embodiment, the reactant gas may be activated inside the gas injection part 30 so as to be injected onto the substrate. In addition, since the first gas supply path for supplying the source gas and the first diffusion gas and the second gas supply path for supplying the reactant gas and the second diffusion gas are provided to be separated from each other, the source gas and the reactant gas may be prevented from reacting within the gas injection part 30 and be distributed and injected into an optimal supply path for depositing the source gas and the reactant gas.

Hereinafter, a method for depositing the thin film in accordance with an exemplary embodiment will be described in detail with reference to FIGS. 2 and 3. In the description of the method for depositing the thin film in accordance with an exemplary embodiment, descriptions duplicated with those of the above-described deposition apparatus will be omitted.

Figure 2:
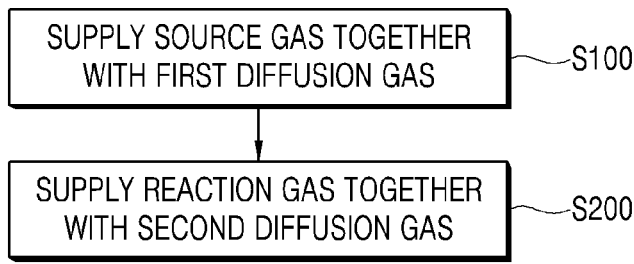
FIG. 2 is a schematic view illustrating a method for depositing a thin film in accordance with an exemplary embodiment.

FIG. 2 is a schematic view illustrating a method for depositing a thin film in accordance with an exemplary embodiment. FIG. 3 is a view for explaining a process cycle in the method for depositing the thin film in accordance with an exemplary embodiment, and FIG. 4 is a view illustrating supply amounts of first diffusion gas and second diffusion gas in accordance with an exemplary embodiment.

Figure 3:
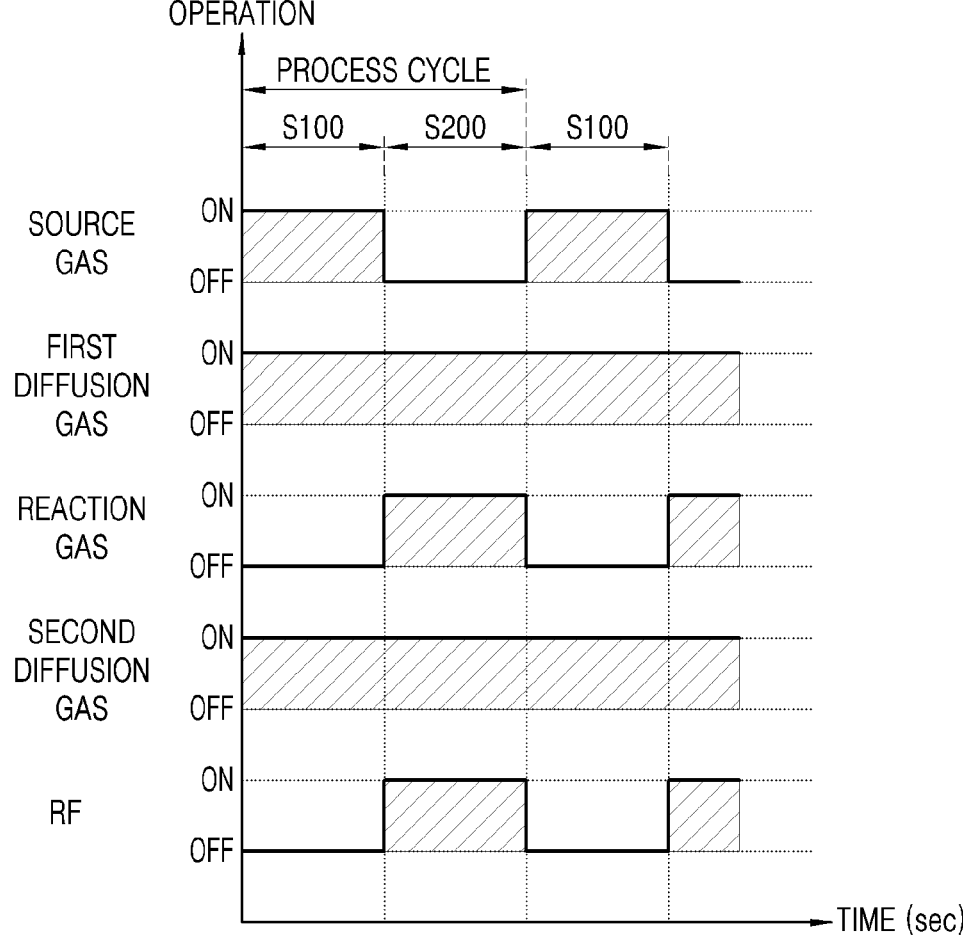
FIG. 3 is a view for explaining a process cycle in the method for depositing the thin film in accordance with an exemplary embodiment.
Figure 4:
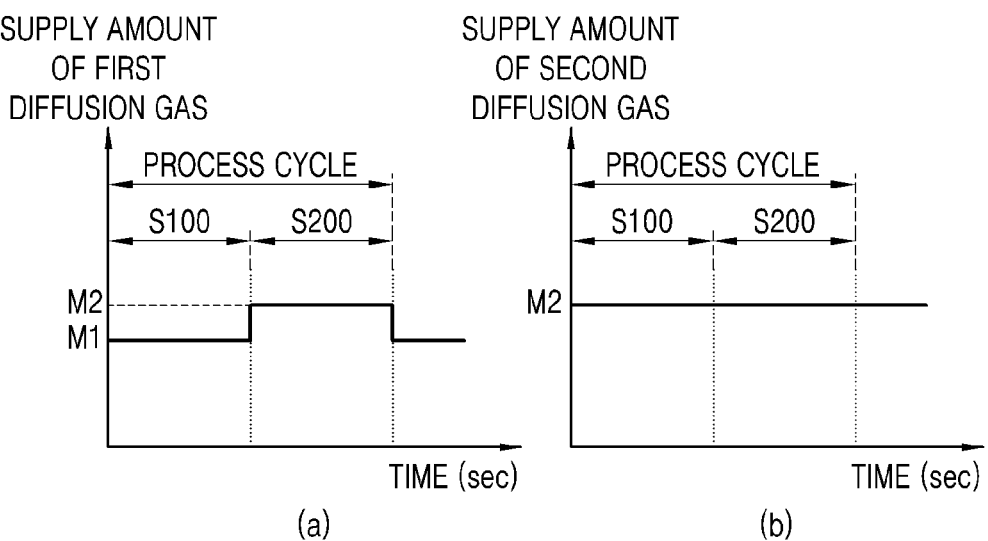
FIG. 4 is a view illustrating supply amounts of first diffusion gas and second diffusion gas in accordance with an exemplary embodiment.

Referring to FIGS. 2 to 4, a method for depositing a thin film in accordance with an exemplary embodiment includes a process (S100) of supplying a source gas together with a first diffusion gas onto a substrate S provided in a process space, and a process (S200) of supplying a reactant gas together with a second diffusion gas onto the substrate S so as to be continuous with the process (S100) of supplying the source gas. Here, in the method for depositing the thin film in accordance with an exemplary embodiment, the first diffusion gas and source gas, and the second diffusion gas and reactant gas are supplied on the substrate S through different paths. In addition, a process cycle including the process (S100) of supplying the source gas and the process (S200) of supplying the reactant gas may be performed several times.

That is, in the method for depositing the thin film in accordance with an exemplary embodiment, the existing processes of purging the source gas and purging the reactant gas in the atomic layer deposition process are omitted. As a result, the process cycle including the process (S100) of supplying the source gas and the process (S200) of supplying the reactant gas may be performed several times to form a thin film having a desired thickness on the substrate S.

Here, when only the process of purging the source gas and the process of purging the reactant gas in the existing atomic layer deposition process are omitted, the source gas may not uniformly adsorbed onto the substrate S to deteriorate deposition uniformity, and also, the reactant gas may react with the source gas remaining in the gas injection part 30 while supplying the reactant gas to generate a large amount of particles in the gas injection part 30.

Thus, in an exemplary embodiment, the source gas may be supplied onto the substrate S together with the first diffusion gas for moving the source gas, and the reactant gas may be supplied onto the substrate S together with the second diffusion gas for moving the reactant gas. In addition, the first diffusion gas and source gas and the second diffusion gas and reactant gas may be supplied onto the substrate through the paths different from each other to prevent the source gas and the reactant gas from previously reacting with each other, and the adsorption of the source gas and the reaction by the reactant gas may be performed on the substrate S to form the thin film having the same quality as that of the thin film formed by the existing atomic deposition process.

That is, as described above, the first gas supply path for supplying the source gas and the first diffusion gas onto the substrate S and the second gas supply path for supplying the reactant gas and the second diffusion gas onto the substrate S may be separately formed in the gas injection part 30. Thus, the source gas and the reactant gas are separated from each other so as not to react with each other before being injected from the gas injection part 30. In addition, the source gas and the first diffusion gas for controlling the movement of the source gas are supplied through the first gas supply path, and the reactant gas and the second diffusion gas for controlling the movement of the reactant gas are supplied through the second gas supply path. Therefore, in the process (S100) of supplying the source gas, the source gas may be rapidly discharged to the outside of the chamber 10 through the process space by the first diffusion gas, and in the process (S200) of supplying the reactant gas, the reactant gas may be rapidly discharged to the outside of the chamber 10 through the process space to minimize the reaction of the source gas and the reactant gas, which simultaneously remain in the process space even after being injected from the gas injection part 30. Hereinafter, the method for depositing the thin film in accordance with an exemplary embodiment that is capable of achieving the above technical effects will be described in more detail.

A process of preparing the substrate S may be performed before the process (S100) of supplying the source gas. In the process of preparing the substrate S, the substrate S is loaded into the chamber 10 of the above-described deposition apparatus and seated on the substrate support part 20. Here, the substrate S may be a substrate for manufacturing a thin film transistor and may include, for example, a silicon substrate, a glass substrate, or a plastic substrate. The thin film transistor manufactured using the prepared substrate S will be described later with reference to FIG. 5.

In the process (S100) of supplying the source gas, the source gas is supplied together with the first diffusion gas onto the substrate S provided in the process space within the chamber 10. Here, the source gas is provided from the source gas supply part 52 of the above-described deposition apparatus and supplied onto the substrate S through the first gas supply path provided in the gas injection part 30. In addition, the first diffusion gas is provided from the first diffusion gas supply part 54 and supplied onto the substrate S through the first gas supply path provided in the gas injection part 30.

Here, the source gas supply part 52 may be connected to one end of the first supply tube 42, and the first diffusion gas supply part 54 may be connected to an extension path of the first supply tube 42 that connects the gas injection part 30 to the source gas supply part 52 while being separated from the source gas supply part 52. Thus, the first diffusion gas may be mixed with the source gas in the first gas supply path and supplied onto the substrate S. As described above, the first diffusion gas may be mixed with the source gas in the first gas supply path and supplied onto the substrate S, and thus, unlike a carrier gas, which is premixed with the source gas so as to serve only to transport the source gas, the first diffusion gas may not only control the movement of the source gas, but also serve to diffuse the source gas on the substrate S.

Here, the source gas may include a source gas for forming the metal oxide thin film. For example, the source gas may be a gas containing at least one of indium (In), gallium (Ga), or zinc (Zn). In addition, the first diffusion gas may include an inert gas for diffusing the source gas, for example, an argon (Ar) gas or a nitrogen ($N_2$) gas. The source gas may not be necessarily provided from one source gas supply part 52, and each of the gas containing indium (In), the gas containing gallium (Ga), and the gas containing zinc (Zn) may be provided, or a selected gas of the plurality of gases may be provided as described above.

In the process (S100) of supplying the source gas, the source gas is supplied together with the first diffusion gas onto the substrate S to adsorb a source material contained in the source gas onto the substrate S while controlling the movement of the source gas. In this case, the process (S100) of supplying the source gas may be performed without applying power.

In the process (S200) of supplying the reactant gas, the reactant gas is supplied together with the second diffusion gas onto the substrate S so as to be continuous with the process (S100) of supplying the source gas. That is, after the process (S100) of supplying the source gas, the process of purging the source gas is not performed, and the process (S200) of supplying the reactant gas is performed to continuous with the process (S100) of supplying the source gas.

In the process (S200) of supplying the reactant gas, the reactant gas is supplied together with the second diffusion gas onto the substrate S onto which the source gas and the first diffusion gas are injected. Here, the reactant gas is provided from the reactant gas supply part 62 of the above-described deposition apparatus and supplied onto the substrate S through the second gas supply path provided in the gas injection part 30. In addition, the second diffusion gas is provided from the second diffusion gas supply part 64 and supplied onto the substrate S through the second gas supply path provided in the gas injection part 30.

Here, the reactant gas supply part 62 may be connected to one end of the second supply tube 44, and the second diffusion gas supply part 64 may be connected to an extension path of the second supply tube 44 that connects the gas injection part 30 to the reactant gas supply part 62 while being separated from the reactant gas supply part 62. Thus, the second diffusion gas may be mixed with the reactant gas in the second gas supply path and supplied onto the substrate S. As described above, like the first diffusion gas, the second diffusion gas may be mixed with the reactant gas in the second gas supply path and supplied onto the substrate S, and thus, unlike a carrier gas, which is premixed with the reactant gas so as to serve only to transport the reactant gas, the second diffusion gas may not only control the movement of the reactant gas, but also serve to diffuse the reactant gas on the substrate S.

Here, the reactant gas may include a reactant gas for forming the metal oxide thin film by reacting with the source gas. For example, the reactant gas may be a gas containing oxygen (O). Also, the second diffusion gas may include an inert gas for diffusing the reactant gas, for example, an argon (Ar) gas or a nitrogen ($N_2$) gas.

Here, in the process (S200) of supplying the reactant gas, the RF power may be applied to the process space so that the reactant gas is activated to generate plasma so as to allow an oxygen (O) component contained in the reactant gas to effectively react with a zinc (Zn) component. As described above, in the process (S200) of supplying the reactant gas, the oxygen-containing gas supplied by activating and supplying the reactant gas may be activated with oxygen radicals to react with the zinc component, and the zinc oxide thin film may be formed on the substrate at a lower process temperature.

In accordance with an exemplary embodiment, in the process (S100) of supplying the source gas, a supply amount of first diffusion gas may be controlled differently from a supply amount of second diffusion gas. That is, in the deposition of the thin film on the substrate S, since a thickness of the thin film is determined in accordance with a degree to which a source material is adsorbed to the substrate S, it is necessary that a supply rate of the source gas supplied on the substrate S is differently controlled in accordance with process conditions to control the thickness of the thin film. Thus, in accordance with an exemplary embodiment, in the process (S100) of supplying the source gas, the supply amount of first diffusion gas may be controlled differently from the supply amount of second diffusion gas in the process (S200) of supplying the reactant gas.

In addition, in the process (S100) of supplying the source gas, the supply amount of first diffusion gas may be controlled to be relatively less than the supply amount of second diffusion gas. That is, in an exemplary embodiment, the supply amount of first diffusion gas in the process (S100) of supplying the source gas may be controlled to be less than the supply of second diffusion gas in the process (S200) of supplying the reactant gas.

That is, as illustrated in FIG. 4, in the process (S100) of supplying the source gas in accordance with an exemplary embodiment, the supply amount of first diffusion gas may be controlled to M1. In addition, in the process (S200) of supplying the reactant gas in accordance with an exemplary embodiment, the supply amount of second diffusion gas may be controlled to M2 greater than M1.

In general, in the atomic layer deposition process, after the source gas is supplied, the source gas is diffused in the process of purging the source gas so as to be uniformly adsorbed onto the substrate S. However, if the process of purging the source gas is not performed after supplying the source gas, the source gas is not uniformly diffused onto the substrate S, and thus, a large amount of source material is adsorbed onto a central portion of the substrate S, and a relatively small amount of source material is adsorbed onto an edge of the substrate S to deteriorate deposition uniformity.

Thus, in an exemplary embodiment, the supply amount M1 of first diffusion gas in the process (S100) of supplying the source gas is controlled to be relatively greater than the supply amount M2 of second diffusion gas in the process (S200) of supplying the reactant gas. As described above, in the process (S200) of supplying the reactant gas, the supply amount M1 of first diffusion gas is controlled to be relatively less than the supply amount M2 of second diffusion gas. As a result, the source gas is diffused onto the substrate S at a relatively slow rate, and thus, the source gas is uniformly diffused to the edge of the substrate S so that the source material is adsorbed onto the substrate S with a uniform thickness. That is, since the thickness of the thin film deposited on the substrate S is determined by a degree of adsorption of the source material, the deposition uniformity may be improved by controlling the supply amount M1 of first diffusion gas to be relatively small. The reactant gas is to provide a reactant for reacting with the source material already adsorbed on the substrate S, and the supply amount M2 of second diffusion gas is controlled to be greater than the supply amount M1 of first diffusion gas in the process (S100) of supplying the source gas so as to quickly provide the reactant for reacting with the source material on the substrate S.

In the process (S100) of supplying the source gas, the second diffusion gas may be supplied onto the substrate S together with the first diffusion gas and the source gas, and in the process (S200) of supplying the reactant gas, the first diffusion gas may be supplied onto the substrate S together with the second diffusion gas and the reactant gas. That is, the method for depositing the thin film in accordance with an exemplary embodiment may include a first process of supplying the first diffusion gas and the source gas into the process space of the chamber 10 through the first gas supply path formed in the gas injection part 30 and supplying the second diffusion gas into the process space through the second gas supply path formed in the gas injection part 30 and a second process of supplying the first diffusion gas into the process space through the first gas supply path and supplying the second diffusion gas and the reactant gas into the process space through the second gas supply path. Here, the first process and the second process may be continuously performed to form one process cycle, and the process cycle in which the first process and the second process are continuously performed may be repeatedly performed.

In more detail, in the process (S100) of supplying the source gas, the first diffusion gas and the source gas are supplied onto the substrate S through the first gas supply path, and simultaneously, the second diffusion gas is supplied onto the substrate S through the second gas supply path. In addition, in the process (S200) of supplying the reactant gas, the second diffusion gas and the reactant gas are supplied onto the substrate S through the second gas supply path, and simultaneously, the first diffusion gas is supplied onto the substrate S through the first gas supply path.

As described above, while the reactant gas and the second diffusion gas are supplied through the second gas supply path, the first diffusion gas may be supplied through the first gas supply path to prevent the reactant gas from being introduced into the first gas supply path, thereby preventing particles from being generated due to the reaction of the source gas and the reactant gas in a first gas supply path. That is, while the source gas and the first diffusion gas are supplied through the first gas supply path, the second diffusion gas may be supplied through the second gas supply path to prevent the source gas from being introduced into the second gas supply path, thereby preventing particles from being generated due to the reaction of the source gas and the reactant gas in a second gas supply path.

In addition, while the reactant gas and the second diffusion gas are supplied through the second gas supply path, the first diffusion gas may be supplied through the first gas supply path to quickly discharge the source gas remaining in the first gas supply path. That is, the supplying of the source gas supplied in the process (S100) of supplying the source gas may be stopped in the process (S200) of supplying the reactant gas, but the source gas that is already discharged in the process (S100) of supplying the source gas may remain in the first gas supply path. Thus, in an exemplary embodiment, while the reactant gas and the second diffusion gas are supplied through the second gas supply path, the first diffusion gas may be supplied through the first gas supply path to minimize generation of impurities due to the reaction of the source gas and the reactant gas in the first gas supply path or the process space. This may be equally applied to the case in which the second diffusion gas is supplied through the second gas supply path while the source gas and the first diffusion gas are supplied through the first gas supply path.

In this case, as a result, the first diffusion gas is continuously supplied onto the substrate S in the process (S100) of supplying the source gas and the process (S200) of supplying the reactant gas. In this case, the supply amount of first diffusion gas may be controlled differently in the process (S100) of supplying the source gas and the process (S200) of supplying the reactant gas. That is, as described above, in the process (S100) of supplying the source gas, the first diffusion gas may be supplied at the supply amount of M1 that is relatively less than the supply amount M2 of second diffusion gas. This is for uniformly distributing the source gas onto the substrate. On the other hand, in the process (S200) of supplying the reactant gas, the first diffusion gas is not for uniformly diffusing the source gas, but for preventing the reactant gas from being introduced into the first gas supply path. Therefore, in the process (S200) of supplying the reactant gas, the first diffusion gas may be supplied at an amount greater than M1, for example, in the process (S200) of supplying the reactant gas, the first diffusion gas may be controlled to be supplied at the amount M2 that is the supply amount of second diffusion gas so that the introduction of the reactant gas is effectively blocked into the first gas supply path.

FIG. 4 illustrates an example, in which in the process (S100) of supplying the source gas and the process (S200) of supplying the reactant gas, the first diffusion gas is supplied at each of the amounts M1 and M2, and, in the process (S100) of supplying the source gas and the process (S200) of supplying the reactant gas, the second diffusion gas is supplied at the amount M2. However, the supply amount of first diffusion gas and the supply amount of second diffusion gas may be variously controlled. For example, in the process (S200) of supplying the reactant gas, the supply amount of first diffusion gas may be controlled to be less or greater than M2 within a range greater than M1. In addition, the supply amount of first diffusion gas and the supply amount of second diffusion gas are not necessarily maintained at M1 or M2 in the process (S100) of supplying the source gas or the process (S200) of supplying the reactant gas. For example, the supply amounts may be variously changed to increase or decrease depending on process conditions.

As described above, the process cycle including the process (S100) of supplying the source gas and the process (S200) of supplying the reactant gas may be performed several times until the thin film having a desired thickness is deposited. That is, in the method for depositing the thin film in accordance with an exemplary embodiment, the process of purging the reactant gas may not be performed after the process (S200) of supplying the reactant gas, and the process (S100) of supplying the source gas and the process (S200) of supplying the reactant gas as one process cycle may be performed several times to deposit the thin film.

Figure 5:
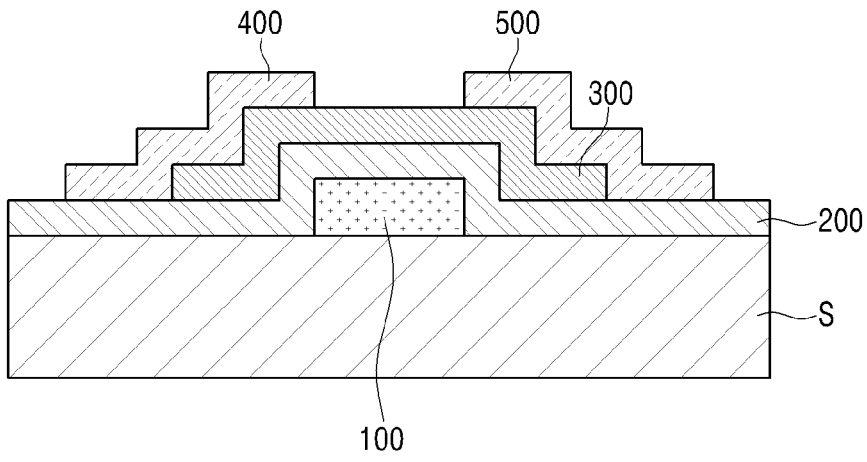
FIG. 5 is a schematic view illustrating a shape of a thin film transistor manufactured in accordance with an exemplary embodiment.

FIG. 5 is a schematic view illustrating a shape of a thin film transistor manufactured in accordance with an exemplary embodiment.

Referring to FIG. 5, a thin film transistor manufactured in accordance with an exemplary embodiment includes a gate electrode 100, a source electrode 400 and drain electrode 500, which are disposed above or below the gate electrode 100 and spaced apart from each other in a horizontal direction, an active layer 300 disposed between the gate electrode 100, the source electrode 400, and the drain electrode 500, and a gate insulating layer 200 disposed between the gate electrode 100 and the active layer 300.

Here, as illustrated in FIG. 5, the thin film transistor in accordance with an exemplary embodiment may be a bottom gate-type thin film transistor, in which the gate electrode 100 formed on the substrate S, the gate insulating layer 200 formed on the gate electrode 100, the active layer 300 formed on the gate insulating layer 200, and the source electrode 400 and drain electrode 500, which are formed to be spaced apart from each other on the active layer 300, and a top gate-type thin film transistor, in which the gate electrode 100 is disposed at an upper side, unlike the bottom gate-type thin film transistor.

Here, a transparent substrate may be used as the substrate S. For example, a silicon substrate, a glass substrate, or a plastic substrate when implementing a flexible display may be used as the substrate S. In addition, a reflective substrate may be used as the substrate S, and in this case, a metal substrate may be used. The metal substrate may be made of stainless steel (SUS), titanium (Ti), molybdenum (Mo), or an alloy thereof. When using the metal substrate as the substrate S, an insulating film may be disposed on the metal substrate.

The gate electrode 100 may be made of a conductive material, for example, at least one metal of aluminum (Al), neodymium (Nd), silver (Ag), chromium (Cr), titanium (Ti), tantalum (Ta), molybdenum (Mo), or an alloy thereof. In addition, the gate electrode 100 may be formed not only as a single layer but also as a multi-layer including a plurality of metal layers. That is, the gate electrode 100 may be formed as a double layer including a metal layer made of chromium (Cr), titanium (Ti), tantalum (Ta), and molybdenum (Mo), which have excellent physical and chemical properties, and a metal layer made of aluminum (Al) series, silver (Ag) series or copper (Cu) series, which have low specific resistance.

The gate insulating layer 200 is formed on at least the gate electrode 100. That is, the gate insulating layer 200 may be formed on the substrate S including the top and side portions of the gate electrode 100. The gate insulating layer 200 may be made of one or more insulating materials of inorganic insulating layers including silicon oxide ($SiO_2$), silicon nitride (SiN), alumina ($Al_2O_3$), and zirconia ($ZrO_2$) having excellent adhesion to metal materials and excellent dielectric strength.

The active layer 300 is disposed between the gate insulating layer 200 and the source electrode 400 and drain electrode 500 and is disposed so that at least a portion thereof overlaps the gate electrode 100. The active layer 300 may be formed to include the metal oxide thin film. As described above, the active layer 300 may be formed through the method for depositing the thin film, which includes the process (S200) of supplying the reactant gas together with the second diffusion gas onto the substrate S to continuous with the process (S100) of supplying the source gas together with the first diffusion gas and process (S100) of supplying the source gas onto the substrate S provided in the process space. In this case, a method for depositing the thin film, in which a process cycle including the process (S100) of supplying the source gas and the process (S200) of supplying the reactant gas is performed several times, and the first diffusion gas and source gas and the second diffusion gas and reactant gas are supplied onto the substrate S through paths different from each other, may be the same as the above-described method for depositing the thin film, and thus, duplicated descriptions thereof will be omitted.

The active layer 300 may be provided as a single metal oxide thin film or a plurality of metal oxide thin films. Here, the active layer 300 may adjust electrical conductivity of the metal oxide thin film by controlling types and contents of metal elements contained in each metal oxide thin film. That is, indium (In) may be a metal having a relatively low band gap and a relatively high standard electrode potential and thus may have characteristics of improving mobility by decreasing in resistance and increasing in electrical conductivity. On the other hand, gallium (Ga) maybe a metal having a relatively high band gap and a relatively high standard electrode potential and thus may have characteristics of improving stability by increasing in resistance and decreasing in electrical conductivity. Thus, an active layer may be formed by controlling contents of indium (In) and gallium (Ga) contained in each of the single metal oxide thin film or the plurality of metal oxide thin films. Such the metal oxide thin film includes at least one thin film of an indium-zinc oxide (IZO; In—Zn—O) thin film, a gallium-zinc oxide (GZO; Ga—Zn—O) thin film, and an indium-gallium-zinc oxide (IGZO; In—Ga—Zn—O) thin film.

The source electrode 400 and the drain electrode 500 are disposed on the active layer 300 to partially overlap the gate electrode 100 and are spaced apart from each other with the gate electrode 100 therebetween. The source electrode 400 and the drain electrode 500 may be formed by the same process using the same material and may be made of a conductive material, for example, may be made of at least one metal of aluminum (Al), neodymium (Nd), silver (Ag), chromium (Cr), titanium (Ti), tantalum (Ta), and molybdenum (Mo), or an alloy thereof. That is, the gate electrode 100 may be made of the same material, but may be made of a different material. In addition, each of the source electrode 400 and the drain electrode 500 may be provided as a single layer as well as a multilayer of a plurality of metal layers.

In accordance with the exemplary embodiment, the process speed at which the thin film is deposited on the substrate may increase.

That is, the process time may be minimized by omitting the process of purging the source gas and the process of purging the reactant gas in the atomic layer deposition process in accordance with the related art.

In addition, even though the process of purging the source gas and the process of purging the reactant gas are omitted, the thin film having the quality equivalent to that of the thin film formed in the atomic layer deposition process in accordance with the related art may be formed.

Although the specific embodiments are described and illustrated by using specific terms, the terms are merely examples for clearly explaining the exemplary embodiments, and thus, it is obvious to those skilled in the art that the exemplary embodiments and technical terms can be carried out in other specific forms and changes without changing the technical idea or essential features. Therefore, it should be understood that simple modifications in accordance with the exemplary embodiments of the present inventive concept may belong to the technical spirit of the present inventive concept.

What is claimed is:

1. A method for depositing a thin film, the method comprising:
   supplying a source gas together with a first diffusion gas onto a substrate provided in a process space; and
   supplying a reactant gas together with a second diffusion gas onto the substrate without supplying a purge gas after supplying the source gas,
   wherein the first diffusion gas and the source gas, and the second diffusion gas and the reactant gas are supplied onto the substrate through paths different from each other.

2. The method for depositing a thin film of claim 1, wherein the first diffusion gas is mixed with the source gas in a path through which the source gas is supplied, and
   the second diffusion gas is mixed with the reactant gas in a path through which the reactant gas is supplied.

3. The method for depositing a thin film of claim 1, wherein, in the supplying of the source gas, the second diffusion gas is supplied together with the first diffusion gas and the source gas onto the substrate, and
   in the supplying of the reactant gas, the first diffusion gas is supplied together with the second diffusion gas and the reactant gas onto the substrate.

4. The method for depositing a thin film of claim 3, wherein, in the supplying of the source gas and the supplying of the reactant gas, a supply amount of the first diffusion gas is differently controlled.

5. The method for depositing a thin film of claim 4, wherein the supply amount of the first diffusion gas in the supplying of the source gas is controlled to be less than the supply amount of the first diffusion gas in the supplying of the reactant gas.

6. The method for depositing a thin film of claim 1, wherein, in the supplying of the reactant gas, power is applied to generate plasma in the process space.

7. The method for depositing a thin film of claim 1, wherein a process cycle comprising the supplying of the source gas and the supplying of the reactant gas is performed several times.

8. The method for depositing a thin film of claim 1, wherein each of the first diffusion gas and the second diffusion gas comprises an inert gas.

9. The method for depositing a thin film of claim 1, wherein the source gas comprises a gas containing at least one of indium (In), gallium (Ga), or zinc (Zn), the reactant gas comprises a gas containing oxygen (O).

10. The method for depositing a thin film of claim 1, wherein, in the supplying of the source gas, a supply amount of the first diffusion gas is controlled to be different from a supply amount of the second diffusion gas.

11. A method for depositing a thin film, the method comprising:

a first process of supplying a first diffusion gas and a source gas through a first gas supply path formed in a gas injection part and supplying a second diffusion gas through a second gas supply path formed in the gas injection part; and a second process of supplying the first diffusion gas through the first gas supply path and supplying the second diffusion gas and the reactant gas through the second gas supply path, wherein a process cycle in which the second process is performed without supplying a purge gas after the first process is performed repeatedly.

12. The method for depositing a thin film of claim 10, wherein, in the supplying of the source gas, a supply amount of the first diffusion gas is controlled to be relatively less than a supply amount of the second diffusion gas.

* * * * *